United States Patent
Hsu

(10) Patent No.: US 12,183,797 B2
(45) Date of Patent: Dec. 31, 2024

(54) PROFILE CONTROL OF CHANNEL STRUCTURES FOR SEMICONDUCTOR DEVICES

(71) Applicant: Taiwan Semicondcutor Manufacturing Co., Ltd., Hsinchu (TW)

(72) Inventor: Chao-Wei Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 482 days.

(21) Appl. No.: 17/471,863

(22) Filed: Sep. 10, 2021

(65) Prior Publication Data

US 2022/0367657 A1    Nov. 17, 2022

Related U.S. Application Data

(60) Provisional application No. 63/187,804, filed on May 12, 2021.

(51) Int. Cl.

| | |
|---|---|
| *H01L 29/08* | (2006.01) |
| *H01L 21/3065* | (2006.01) |
| *H01L 29/06* | (2006.01) |
| *H01L 29/417* | (2006.01) |
| *H01L 29/423* | (2006.01) |
| *H01L 29/66* | (2006.01) |
| *H01L 29/786* | (2006.01) |

(52) U.S. Cl.
CPC .... *H01L 29/42392* (2013.01); *H01L 21/3065* (2013.01); *H01L 29/0665* (2013.01); *H01L 29/0847* (2013.01); *H01L 29/41775* (2013.01); *H01L 29/66553* (2013.01); *H01L 29/78696* (2013.01)

(58) Field of Classification Search
CPC ......... H01L 29/42392; H01L 29/0847; H01L 29/41775; H01L 29/66553; H01L 21/3065
USPC ...................................................... 257/401
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |

(Continued)

*Primary Examiner* — Dzung Tran

(74) *Attorney, Agent, or Firm* — Sterne, Kessler, Goldstein & Fox P.L.L.C.

(57) ABSTRACT

The present disclosure describes a semiconductor device having a channel structure with profile control. The semiconductor device includes a fin structure on a substrate. The fin structure includes a bottom portion on the substrate and a top portion including multiple semiconductor layers. The semiconductor device further includes a gate structure wrapped around the multiple semiconductor layers and a source/drain (S/D) structure on the bottom portion of the fin structure and in contact with the plurality of semiconductor layers. The S/D structure extends into end portions of the multiple semiconductor layers.

20 Claims, 16 Drawing Sheets

(56) References Cited

U.S. PATENT DOCUMENTS

| | | | |
|---|---|---|---|
| 2015/0380539 A1* | 12/2015 | Colinge | H01L 29/413 |
| | | | 438/268 |
| 2017/0104061 A1* | 4/2017 | Peng | H01L 29/78696 |
| 2018/0151452 A1* | 5/2018 | Doornbos | H01L 29/0673 |
| 2019/0221639 A1* | 7/2019 | Tseng | H01L 29/1033 |
| 2020/0083339 A1* | 3/2020 | Cheng | H01L 29/78696 |
| 2020/0373206 A1* | 11/2020 | Cheng | H01L 29/42392 |

* cited by examiner

400

```
┌─────────────────────────────────────────────────────────────┐
│ Form a fin structure on a substrate, where the fin structure│
│ includes a bottom portion on the substrate and a top        │──410
│ portion including multiple semiconductor layers             │
└─────────────────────────────────────────────────────────────┘
                              ▼
┌─────────────────────────────────────────────────────────────┐
│         Form a gate structure on the fin structure          │──420
└─────────────────────────────────────────────────────────────┘
                              ▼
┌─────────────────────────────────────────────────────────────┐
│ Form a first spacer structure on sidewalls of the gate      │──430
│ structure and a second spacer structure on sidewalls of     │
│ the fin structure                                           │
└─────────────────────────────────────────────────────────────┘
                              ▼
┌─────────────────────────────────────────────────────────────┐
│ Remove a portion of the fin structure outside the gate      │──440
│ structure to expose end portions of the multiple            │
│ semiconductor layers                                        │
└─────────────────────────────────────────────────────────────┘
                              ▼
┌─────────────────────────────────────────────────────────────┐
│ Etch the end portions of the multiple semiconductor layers  │──450
│ under the first spacer structure to form a recessed region  │
└─────────────────────────────────────────────────────────────┘
                              ▼
┌─────────────────────────────────────────────────────────────┐
│         Form source/drain and metal gate structures         │──460
└─────────────────────────────────────────────────────────────┘
```

Fig. 4

PROFILE CONTROL OF CHANNEL STRUCTURES FOR SEMICONDUCTOR DEVICES

CROSS-REFERENCE TO RELATED APPLICATIONS

This application claims the benefit of U.S. Provisional Patent Application No. 63/187,804, titled "Gate-All-Around Transistor Channel Structure for Device Improvement," filed May 12, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIG. 4 is a flow diagram of a method for fabricating a semiconductor device having a channel structure with profile control, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
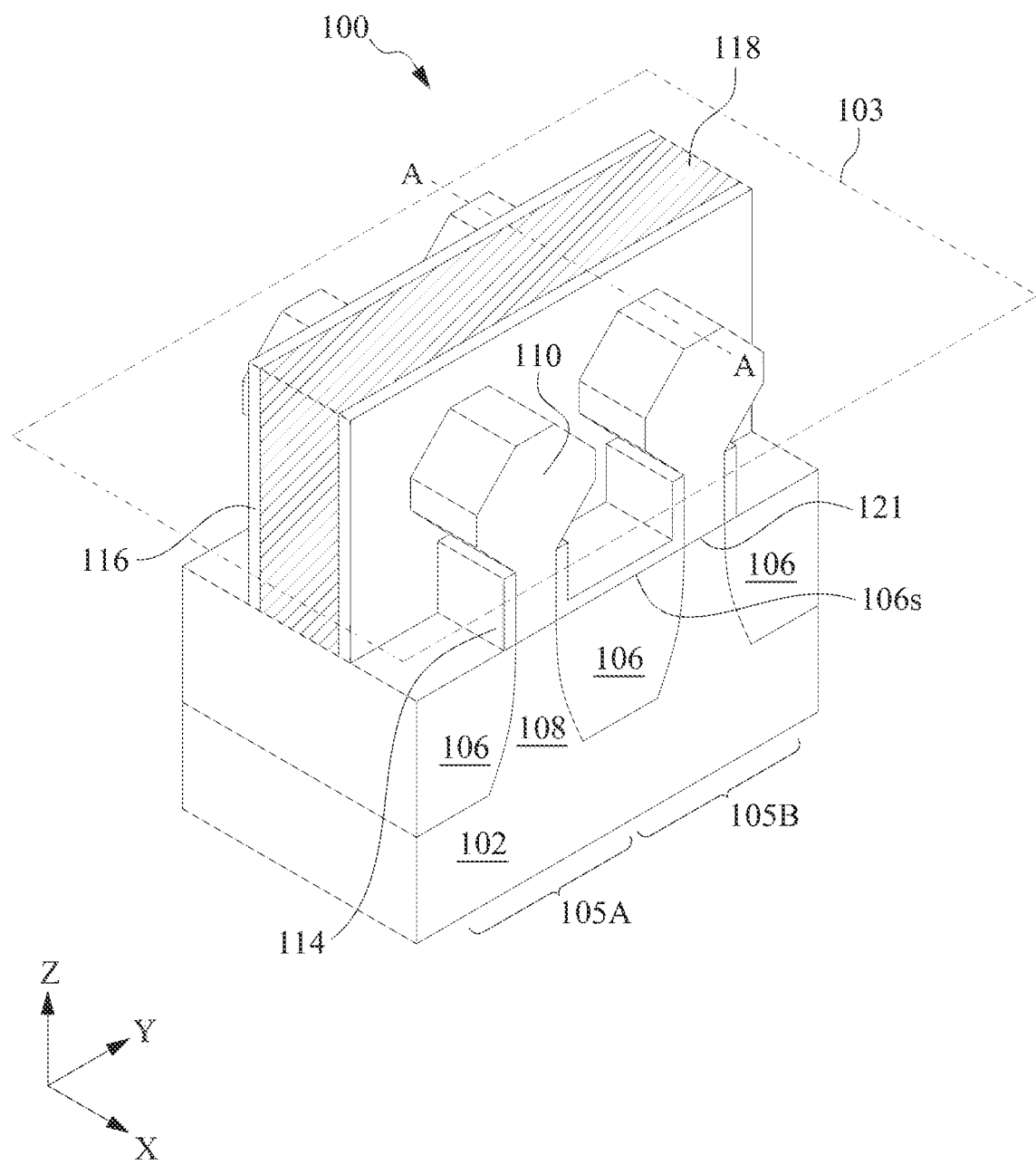
FIG. 1 illustrates an isometric view of a semiconductor device having a channel structure with profile control, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, increase on-state channel current to off-state channel current ratio (Ion/Ioff), and reduce short-channel effects (SCEs). One such multi-gate device is the gate-all-around fin field effect transistor (GAA finFET). The GAA finFET device provides a channel in a stacked nanosheet/nanowire configuration, for which the GAA finFET device can also be referred to as "a nanosheet device." The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, the GAA finFET devices can have their challenges. For example, GAA finFET devices can improve device performance by reducing parasitic capacitance between the gate structure and the source/drain (S/D) structure. However, the capacitance reduction may increase gate spacer width, which can increase the channel length and as a result can degrade Ion and device speed. In another example, GAA finFET devices can improve Ion by increasing a ratio of channel thickness to gate thickness between channel structures. But the increase of the ratio can lead to smaller gate thickness and worse control of Ioff or gate leakage current.

Various embodiments in the present disclosure provide example methods for forming channel structures with profile control in GAA field effect transistors (FET) devices and/or other semiconductor devices in an integrated circuit (IC) and example semiconductor devices fabricated with the same methods. The example methods in the present disclosure can form a channel structure having recessed end portions and form a S/D structure extending into the recessed end portions of the channel structure. In some embodiments, end portions of the channel structure can be etched by hydrogen chloride (HCl) and the profile of the end portions of the channel structure can be controlled by an etch temperature, an etch pressure, a flow rate of HCl, and/or a source material. In some embodiments, the end portions of the channel structure can have a V shape from a top-down view including a sloped recessed center region. In some embodiments, the end portions of the channel structure can have a sigma (Σ) shape from a top-down view including a recessed intermediate region. In some embodiments, the end portions of the channel structure can have a pi (Π) shape from a top-down view including a flat recessed center region. With profile control of the channel structure, an effective channel length can be reduced to increase Ion and device speed. In addition, the resistance between the channel structure and the S/D structure can be reduced. In some embodiments, device performance can be improved by about 5% to about 10% with profile control of the channel structure.

Though the present disclosure describes profile control of channel structures for GAA finFET devices, channel structures with profile control and the methods for controlling the profile of end portions of channel structures described herein can be applied to other types of FETs and other semiconductor devices, such as finFETs and MOSFETs.

Figure 2:
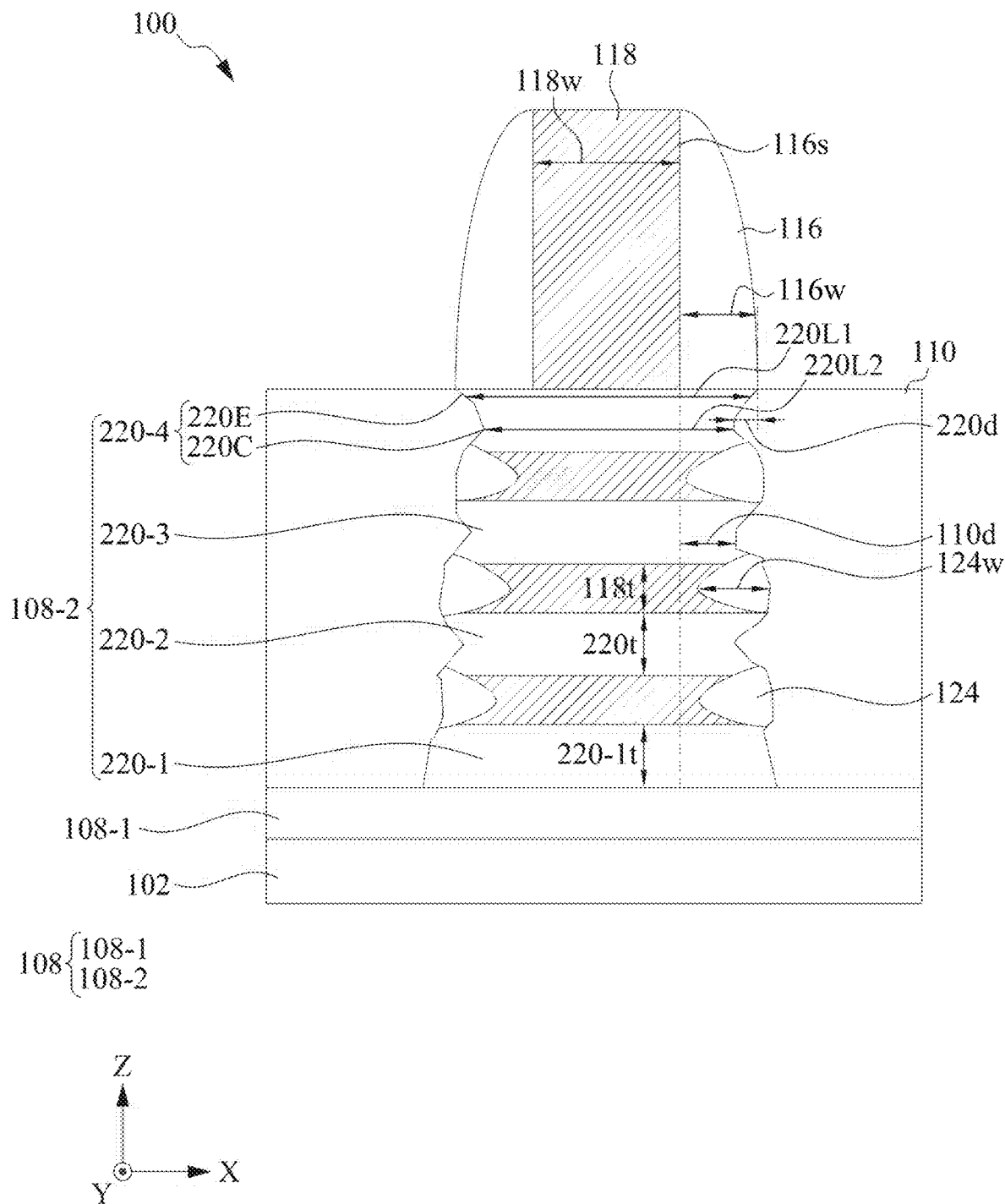
FIGS. 2 and 3A-3C illustrate various cross-sectional views of a semiconductor device having a channel structure with profile control, in accordance with some embodiments.
Figure 3A:
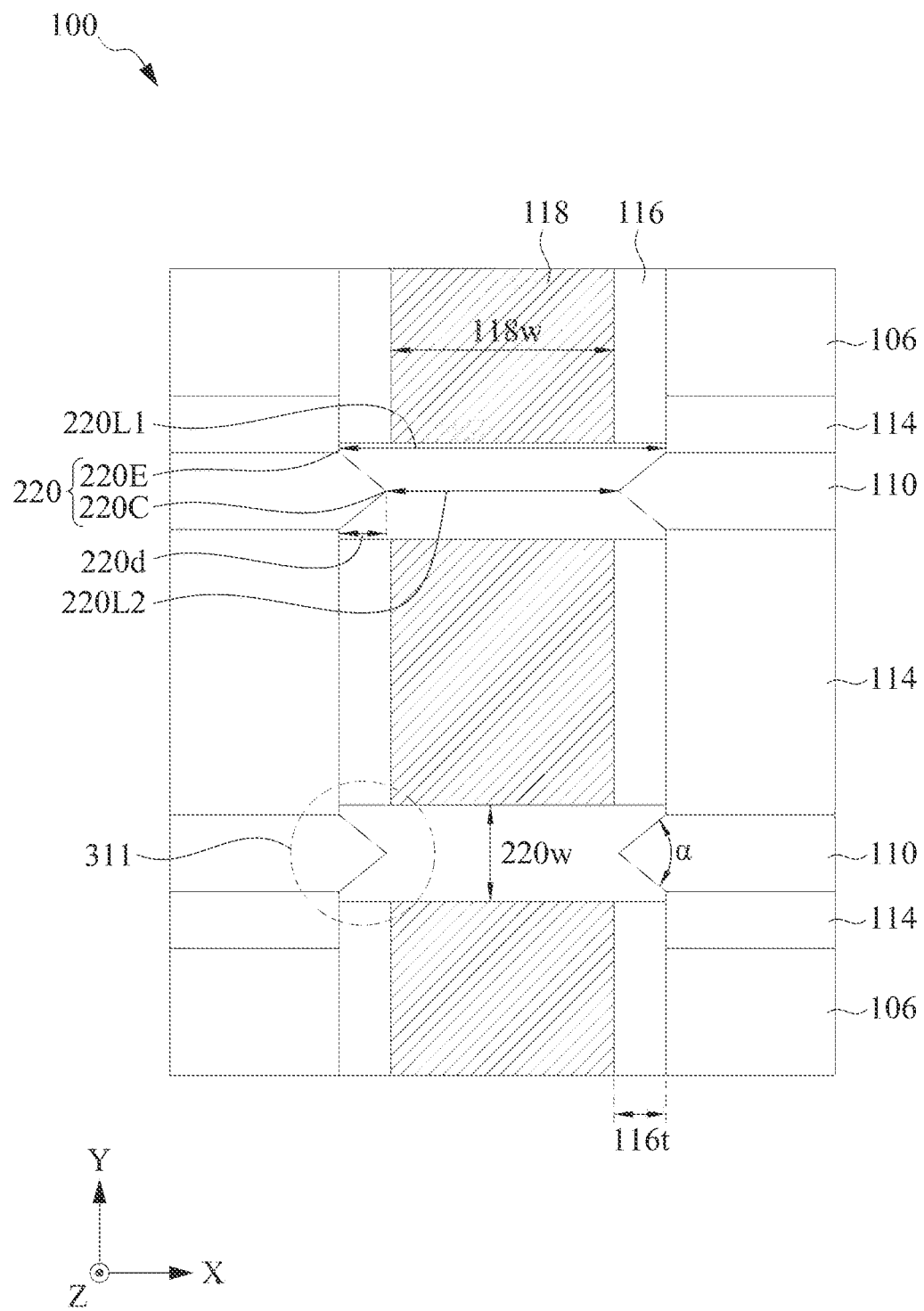
Figure 3B:
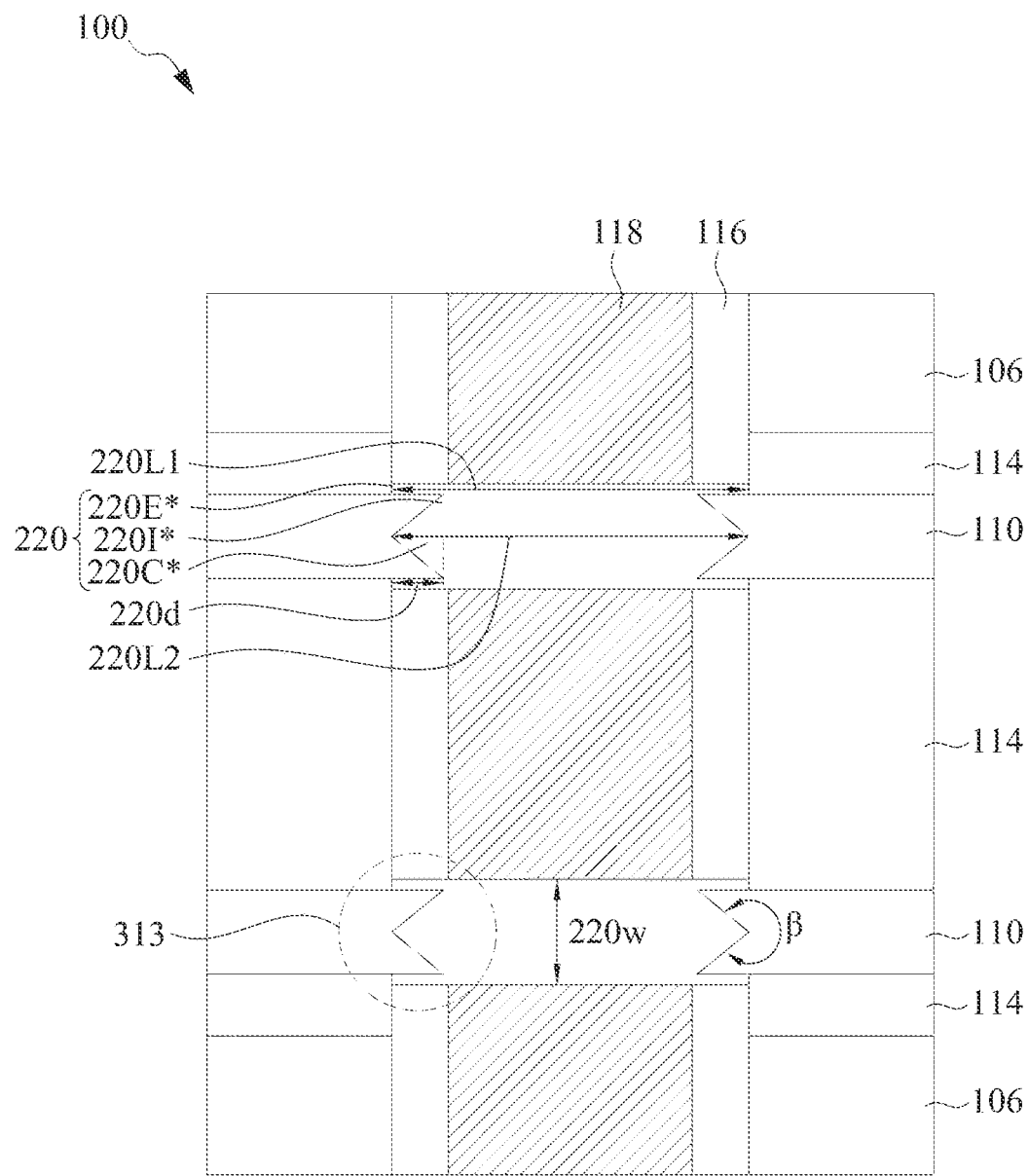
Figure 3C:
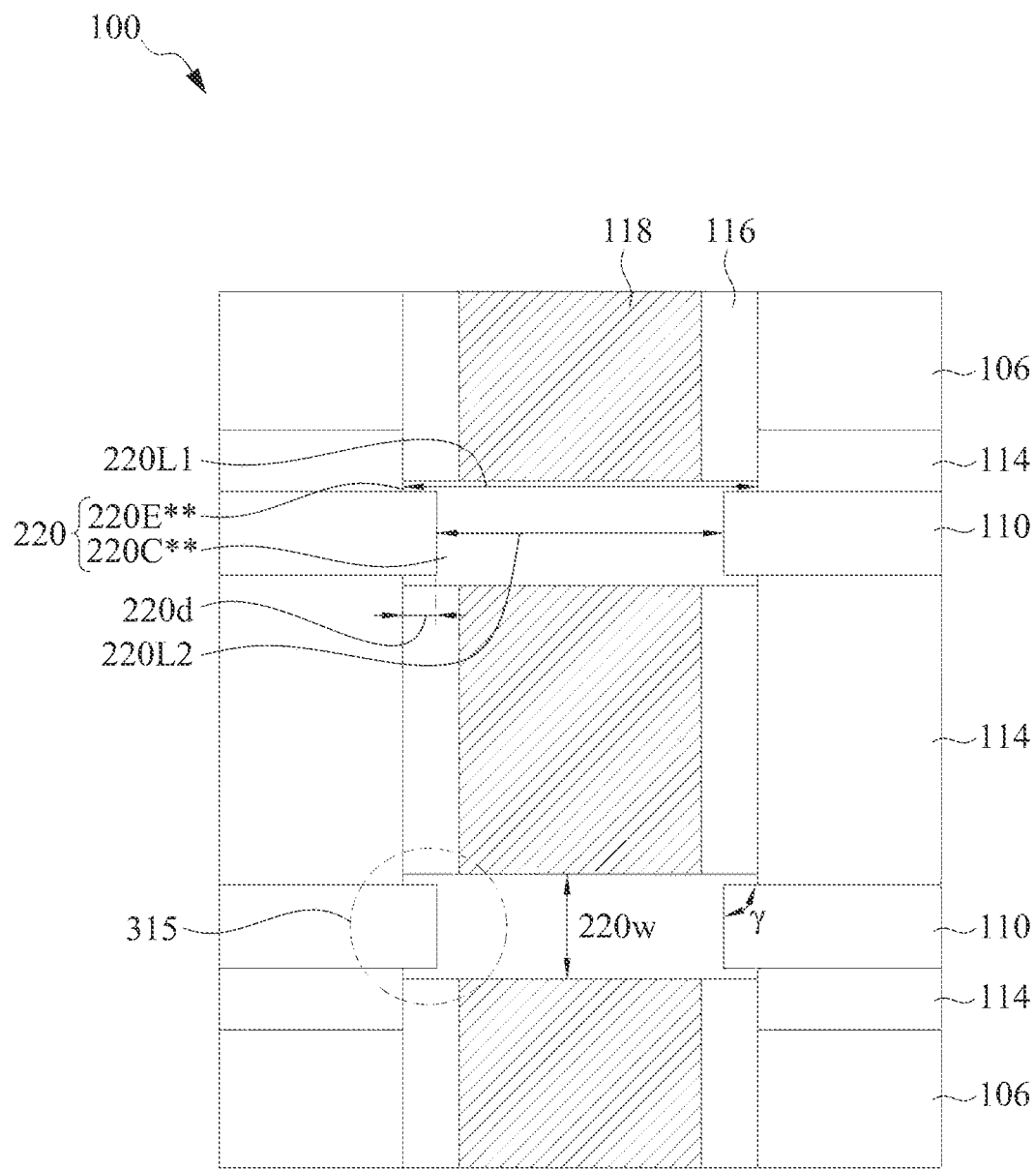

FIG. 1 illustrates an isometric view of a semiconductor device 100 having fin structures 108 with profile control, in accordance with some embodiments. FIG. 2 illustrates a cross-sectional view of semiconductor device 100 along line A-A in FIG. 1, in accordance with some embodiments. FIGS. 3A-3C illustrates top-down cross-sectional views of semiconductor device 100 across plane 103 in FIG. 1, in accordance with some embodiments. FIGS. 3A-3C illustrate various profiles of semiconductor layers 220 in fin structures 108, in accordance with some embodiments. In some embodiments, an X-axis in FIGS. 1, 2, 3A-3C, 5-8, and 9A-9C can be along a <110> direction. A Y-axis in FIGS. 1, 2, 3A-3C, 5-8, and 9A-9C can be along a <1-10> direction. A Z-axis in FIGS. 1, 2, 3A-3C, 5-8, and 9A-9C can be along a <001> direction.

Referring to FIGS. 1, 2 and 3A-3C, semiconductor device 100 having FETs 105A-105B can be formed on a substrate 102 and can include fin structures 108, shallow trench isolation (STI) regions 106, S/D structures 110, fin sidewall spacers 114, gate spacers 116, gate structures 118, and inner spacer structures 124. In some embodiments, FETs 105A-105B can be GAA finFETs. In some embodiments, FET 105A can be n-type FETs (NFET) and have n-type S/D structures 110. FET 105B can be p-type FETs (PFET) and have p-type S/D structures 110. In some embodiments, FETs 105A-105B can be both NFETs. In some embodiments, FETs 105A-105B can be both PFETs. Though FIG. 1 shows two FETs, semiconductor device 100 can have any number of FETs. In addition, semiconductor device 100 can be incorporated into an integrated circuit (IC) through the use of other structural components, such as S/D contact structures, gate contacts, conductive vias, conductive lines, dielectric layers, passivation layers, and interconnects, which are not shown for simplicity. The discussion of elements of FETs 105A-105B with the same annotations applies to each other, unless mentioned otherwise.

Substrate 102 can include a semiconductor material, such as silicon (Si). In some embodiments, substrate 102 can include a crystalline silicon substrate (e.g., wafer). In some embodiments, substrate 102 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on insulator structure (SiGeOI); (vi) germanium-on-insulator (GeOI) structure; (vii) a III-V semiconductor, such as gallium nitride (GaN); and (viii) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI regions 106 can provide electrical isolation to fin structures 108 from adjacent fin structures and to semiconductor device 100 from neighboring structures integrated with or deposited onto substrate 102. STI regions 106 can include a dielectric material, such as silicon oxide ($SiO_x$), silicon nitride ($SiN_x$), silicon oxynitride (SiON), fluorine-doped silicate glass (FSG), a low-k dielectric material, and other suitable insulating materials. In some embodiments, STI regions 106 can include a multi-layered structure.

Fin structures 108 can be formed from patterned portions of substrate 102. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

As shown in FIGS. 1 and 2, fin structures 108 can be disposed underlying S/D structures 110 and gate structures 118 and can extend along an X-axis through gate structures 118. As shown in FIG. 2, fin structures 108 can include a fin bottom portion 108-1 disposed on substrate 102 and a fin top portion 108-2 disposed on fin bottom portion 108-1. In some embodiments, fin bottom portion 108-1 can include a semiconductor material similar to substrate 102. In some embodiments, fin top portion 108-2 can include a stack of semiconductor layers 220-1, 220-2, 220-3, and 220-4 (collectively referred to as "semiconductor layers 220"), which can be in the form of nanosheets or nanowires. Each of semiconductor layers 220 can form a channel structure underlying gate structures 118 of FETs 105A-105B and represent current carrying structures of semiconductor device 100.

Semiconductor layers 220 can include semiconductor materials similar to or different from substrate 102. In some embodiments, each of semiconductor layers 220 can include Si without any substantial amount of Ge or can include SiGe with Ge in a range from about 0.1 atomic percent to about 50 atomic percent with any remaining atomic percent being silicon. The semiconductor materials of semiconductor layers 220 can be undoped or can be in-situ doped during its epitaxial growth process using: (i) p-type dopants, such as boron, indium, and gallium; and/or (ii) n-type dopants, such as phosphorus and arsenic. In some embodiments, as shown in FIG. 2, semiconductor layer 220-1 can have a thickness 220-1$t$ along a Z-axis ranging from about 10 nm to about 15 nm to reduce defect formation during epitaxial growth of semiconductor layers 220 on substrate 102. Semiconductor layers 220-2, 220-3, and 220-4 can have a thickness 220$t$ along a Z-axis ranging from about 5 nm to about 15 nm. In some embodiments, as shown in FIG. 3A, semiconductor layers 220 can have a width 220$w$ along a Y-axis ranging from about 3 nm to about 10 nm. Though four layers of semiconductor layers 220 for semiconductor device 100 are shown in FIG. 2, semiconductor device 100 can have any number of semiconductor layers 220.

Referring to FIGS. 2 and 3A-3C, end portions of semiconductor layers 220 can have various shapes with profile control to improve device performance. In some embodiments, as shown in FIGS. 2 and 3A, end portions of semiconductor layers 220 can have a V shape 311 from a top-down view and semiconductor layers 220 can include a sloped recessed center region 220C and an edge region 220E. In some embodiments, sloped recessed center region 220C can be recessed for a distance 220$d$ along an X-axis ranging from about 1 nm to about 5 nm. In some embodiments, semiconductor layers 220 can have a length 220L1 along an X-axis at edge region 220E ranging from about 30 nm to about 35 nm. Length 220L1 can also be referred to as the "channel length" of semiconductor device 100. In some embodiments, semiconductor layers 220 can have a length 220L2 along an X-axis at sloped recessed center region 220C ranging from about 27 nm to about 31 nm. The device current Ion can flow mostly through sloped recessed center region 220C, which has a shortest channel length between S/D structures 110 at opposite ends of semiconductor layers 220. Accordingly, length 220L2 of sloped recessed center region 220C can be referred to as the "effective channel length 220L2" of semiconductor device 100. As effective channel length 220L2 is less than channel length 220L1, the device current Ion can be reduced and the device performance of semiconductor device 100 can be improved. In some embodiments, as shown from a top-down view in FIG. 3A, end portions of semiconductor layers 220 can have an angle α for the V shape 311. In some embodiments, angle α can range from about 100 degrees to about 150 degrees due to the crystallinity of semiconductor layers 220.

In some embodiments, as shown in FIG. 3B, end portions of semiconductor layers 220 can have a sigma (Σ) shape 313 from a top-down view and semiconductor layers 220 can include a center region 220C*, an edge region 220E*, and a recessed intermediate region 220I* between center region 220C* and edge region 220E*. In some embodiments, sloped intermediate region 220I* can be recessed for distance 220$d$ along an X-axis ranging from about 2 nm to about 6 nm. In some embodiments, semiconductor layers 220 can have length 220L1 along an X-axis at edge region 220E* ranging from about 30 nm to about 35 nm. In some embodiments, semiconductor layers 220 can have effective channel length 220L2 along an X-axis at recessed intermediate region 220I* ranging from about 25 nm to about 29 nm. In some embodiments, as shown from a top-down view in FIG. 3B, end portions of semiconductor layers 220 can have an angle β for the sigma (Σ) shape 313. In some embodiments, angle β can range from about 180 degrees to about 210 degrees due to the crystallinity of semiconductor layers 220.

In some embodiments, as shown in FIG. 3C, end portions of semiconductor layers 220 can have a pi (Π) shape 315 from a top-down view and semiconductor layers 220 can include a flat recessed center region 220C and edge region 220E. In some embodiments, flat recessed center region 220C can be recessed for distance 220$d$ along an X-axis ranging from about 4 nm to about 8 nm. In some embodiments, semiconductor layers 220 can have length 220L1 along an X-axis at edge region 220E ranging from about 30 nm to about 35 nm. In some embodiments, semiconductor layers 220 can have effective channel length 220L2 along an X-axis at flat recessed center region 220C** ranging from about 23 nm to about 27 nm. In some embodiments, as shown from a top-down view in FIG. 3C, end portions of semiconductor layers 220 can have an angle γ for the pi (Π) shape 315. In some embodiments, angle γ can range from about 80 degrees to about 120 degrees due to the crystallinity of semiconductor layers 220.

In some embodiments, as shown in FIGS. 3A-3C, a first ratio of distance 220$d$ to length 220L1 can range from about 5% to about 15% and a second ratio of length 220L2 to length 220L1 can range from about 70% to about 95%. If distance 220$d$ is less than about 1 nm, the first ratio is less than about 5%, length 220L2 is greater than about 31 nm, or the second ratio is greater than about 95%, device current Ion may not be increased and device performance may not be improved. If distance 220$d$ is greater than about 8 nm, the first ratio is greater than about 15%, length 220L2 is less than about 23 nm, or the second ratio is less than about 70%, S/D structures 110 may extend under gate structures 118 and overlap with gate structures 118, parasitic capacitance between gate structures 118 and S/D structures 110 may increase, and device performance may degrade. In some embodiments, device performance of semiconductor device 100 can be improved by about 5% to about 10% with profile control of semiconductor layers 220.

In some embodiments, with profile control, end portions of semiconductor layers 220 can have improved surface roughness. In some embodiments, the surface roughness for end portions of semiconductor layers 220 can range from about 0.12 nm to about 0.16 nm. Compared to semiconductor layers without profile control, the surface roughness for end portions of semiconductor layers 220 can be reduced by about 15% to about 25%.

Referring to FIGS. 1, 2, and 3A-3C, S/D structures 110 can be disposed on partially-recessed fin regions on substrate 102. These partially-recessed fin regions can be partially recessed portions of fin structures 108 that are not underlying gate structures 118. Top surfaces of these partially-recessed fin regions can form interfaces 121 with S/D structures 110. In some embodiments, interfaces 121 can be coplanar with surfaces 106$s$ of STI regions 106, as shown in FIG. 1. In some embodiments, interfaces 121 can be below surfaces 106$s$ of STI regions 106. In some embodiments, interfaces 121 can be above surfaces 106$s$ of STI regions 106. Bottom surfaces of these partially-recessed portions of fin structures 108 may form interfaces (not shown) with substrate 102 and these interfaces may be either above or below the level of interfaces between STI regions 106 and substrate 102.

As shown in FIGS. 1, 2, and 3A-3C, S/D structures 110 can be on opposite ends of semiconductor layers 220 and can extend into the recessed region of the end portions. For example, S/D structures 110 can extend into sloped recessed center region 220C shown in FIG. 3A, recessed intermediate region 220I* shown in FIG. 3B, and flat recessed center region 220C** in FIG. 3C. S/D structures 110 can laterally extend along an X-axis beyond sidewall surfaces of gate spacers 116 and inner spacer structures 124 adjacent to S/D structures 110. In some embodiments, S/D structures 110 can laterally extend below gate spacers 116 but not beyond an interface 116s between gate structures 118 and gate spacers 116. In some embodiments, as shown in FIG. 2, a distance of the S/D structures extending into the end portions of semiconductor layers 220 can be the same as distance 220d ranging from about 1 nm to about 8 nm. S/D structures 110 can have a width (not shown) along an X-axis between adjacent fin structures 108 ranging from about 20 nm to about 30 nm. A distance 110d along an X-axis between S/D structures 110 and sidewalls of gate structures 118 can range from about 1 nm to about 7 nm. Distance 110d can also be referred to as "a proximity length" between S/D structures 110 and gate structures 118. In some embodiments, a distance between S/D structures 110 on opposite ends of semiconductor layers 220 along an X-axis can be the same as effective channel length 220L2 ranging from about 23 nm to about 31 nm. In some embodiments, with profile control of semiconductor layers 220, effective channel length 220L2 and the distance between S/D structures 110 on opposite ends of semiconductor layers 220 can be reduced. As a result, channel current Ion can increase and device speed can be improved. In some embodiments, with profile control of semiconductor layers 220, contact areas between semiconductor layers 220 and S/D structures 110 can increase, which can reduce the contact resistance between semiconductor layers 220 and S/D structures 110 and further increase channel current Ion. In some embodiments, the dimension of S/D structures 110 can increase when S/D structures 110 extends into end portions of semiconductor layers 220. With the increase of the dimension of S/D structures 110, the resistance of S/D structures 110 and the contact resistance between S/D structures 110 and contact structures (not shown) can decrease.

S/D structures 110 can function as S/D regions of semiconductor device 100. In some embodiments, S/D structures 110 can have any geometric shape, such as a polygon, an ellipse, and a circle. In some embodiments, S/D structures 110 can include an epitaxially-grown semiconductor material the same as the material of substrate 102. In some embodiments, the epitaxially-grown semiconductor material can include a material different from the material of substrate 102 and imparts a strain on the channel regions of semiconductor device 100. Since the lattice constant of such epitaxially-grown semiconductor material is different from the material of substrate 102, the channel regions are strained to advantageously increase carrier mobility in the channel regions of semiconductor device 100. The epitaxially-grown semiconductor material can include: (i) a semiconductor material, such as Ge and Si; (ii) a compound semiconductor material, such as gallium arsenide (GaAs) and aluminum gallium arsenide (AlGaAs); or (iii) a semiconductor alloy, such as SiGe and gallium arsenide phosphide (GaAsP).

In some embodiments, S/D structures 110 can include Si and can be in-situ doped during an epitaxial growth process using n-type dopants, such as phosphorus and arsenic. In some embodiments, S/D structures 110 can include phosphorus doped Si with a phosphorus concentration from about 1E20 cm$^{-3}$ to about 5E21 cm$^{-3}$ or arsenic doped Si with an arsenic concentration from about 1E20 cm$^{-3}$ to about 5E21 cm$^{-3}$. In some embodiments, S/D structures 110 can include Si, SiGe, Ge, or III-V materials (e.g., indium antimonide, gallium antimonide, or indium gallium antimonide) and can be in-situ doped during an epitaxial growth process using p-type dopants (e.g., boron, indium, and gallium). In some embodiments, S/D structures 110 can include boron doped Ge with Ge in a range from about 0.1 atomic percent to about 60 atomic percent and a boron concentration from about 1E20 cm$^{-3}$ to about 1E22 cm$^{-3}$. In some embodiments, S/D structures 110 can include one or more epitaxial layers and each epitaxial layer can have different dopant concentration and/or different material compositions.

Gate spacers 116 can be disposed on sidewalls of gate structures 118. Fin sidewall spacers 114 can be disposed on sidewalls of fin structures 108 and S/D structures 110. Inner spacer structures 124 can be disposed between gate structures 118 and S/D structures 110. Gate spacers 116, fin sidewall spacers 114, and inner spacer structures 124 can include a dielectric material, such as $SiO_x$, SiON, $SiN_x$, silicon oxycarbide (SiOC), silicon carbonitride (SiCN), silicon oxynitricarbide (SiOCN), and a combination thereof. In some embodiments, each of gate spacers 116, fin sidewall spacers 114, and inner spacer structures 124 can include a single layer or multiple layers of insulating materials. In some embodiments, gate spacers 116 and inner spacer structures 124 can isolate gate structures 118 and S/D structures 110. In some embodiments, gate spacers 116 can have a width 116w along an X-axis ranging from about 4 nm to about 8 nm. In some embodiments, inner spacer structures 124 can have a width 124w along an X-axis ranging from about 4 nm to about 10 nm. Distance 220d of S/D structures 110 extending into the end portions of semiconductor layers 220 can be less than width 116w of gate spacers 116. In some embodiments, fin sidewall spacers 114 can control the shape of S/D structures 110.

Referring to FIGS. 1, 2, and 3A-3C, gate structures 118 can be multi-layered structures and can be wrapped around semiconductor layers 220 of fin structures 108. In some embodiments, each of semiconductor layers 220 of fin structures 108 can be wrapped around by one or more layers of gate structures 118.

Gate structures 118 can include an interfacial layer, a gate dielectric layer, and a gate electrode wrapped around semiconductor layers 220. The interfacial layer and the gate dielectric layer can be wrapped around each of semiconductor layers 220, and thus electrically isolate semiconductor layers 220 from each other and from the conductive gate electrode to prevent shorting between gate structures 118 and semiconductor layers 220 during operation of FETs 105A-105B. In some embodiments, the interfacial layer can include $SiO_x$. In some embodiments, the gate dielectric layer can include a high-k dielectric material. The term "high-k" can refer to a high dielectric constant. In the field of semiconductor device structures and manufacturing processes, high-k can refer to a dielectric constant that is greater than the dielectric constant of $SiO_x$ (e.g., greater than about 3.9). In some embodiments, the high-k dielectric material can include hafnium oxide ($HfO_x$), titanium oxide ($TiO_x$), silicide, or any suitable dielectric material. In some embodiments, the gate electrode can include a gate barrier layer, a gate work function layer, and a gate metal fill layer (not shown). In some embodiments, the gate electrode can include titanium (Ti), tantalum (Ta), titanium nitride (TiN), tantalum nitride (TaN), aluminum (Al), copper (Cu), tungsten (W), cobalt (Co), or other suitable conductive materials.

In some embodiments, as shown in FIG. 2, gate structures 118 between semiconductor layers 220 can have a thickness 118t along a Z-axis ranging from about 5 nm to about 15 nm. In some embodiments, as shown in FIG. 3A, gate structures 118 can have a width 118w along an X-axis ranging from about 10 nm to about 20 nm. In some embodiments, width 118w of gate structures 118 can be less than length 220L 1 of semiconductor layers 220 to prevent overlapping of gate structures 118 and S/D structures 110.

FIG. 4 is a flow diagram of a method 400 for fabricating a semiconductor device having a channel structure with profile control, in accordance with some embodiments. Method 400 may not be limited to GAA FET devices and can be applicable to devices that would benefit from channel structures with profile control, such as planar FETs and finFETs. Additional fabrication operations may be performed between various operations of method 400 and may be omitted merely for clarity and ease of description. Additional processes can be provided before, during, and/or after method 400; one or more of these additional processes are briefly described herein. Moreover, not all operations may be needed to perform the disclosure provided herein. Additionally, some of the operations may be performed simultaneously or in a different order than shown in FIG. 4. In some embodiments, one or more other operations may be performed in addition to or in place of the presently described operations.

Figure 8:
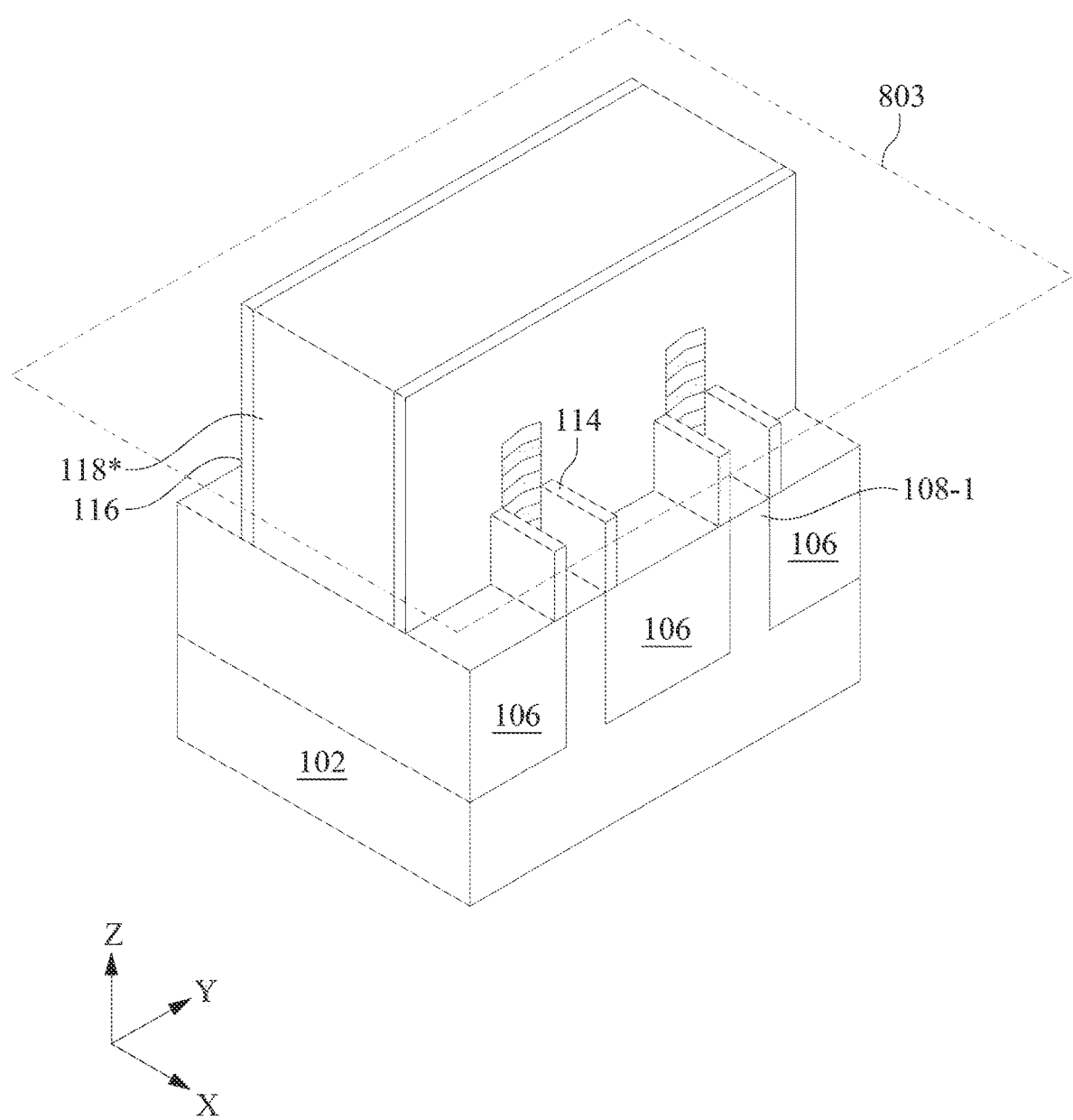
Figure 9A:
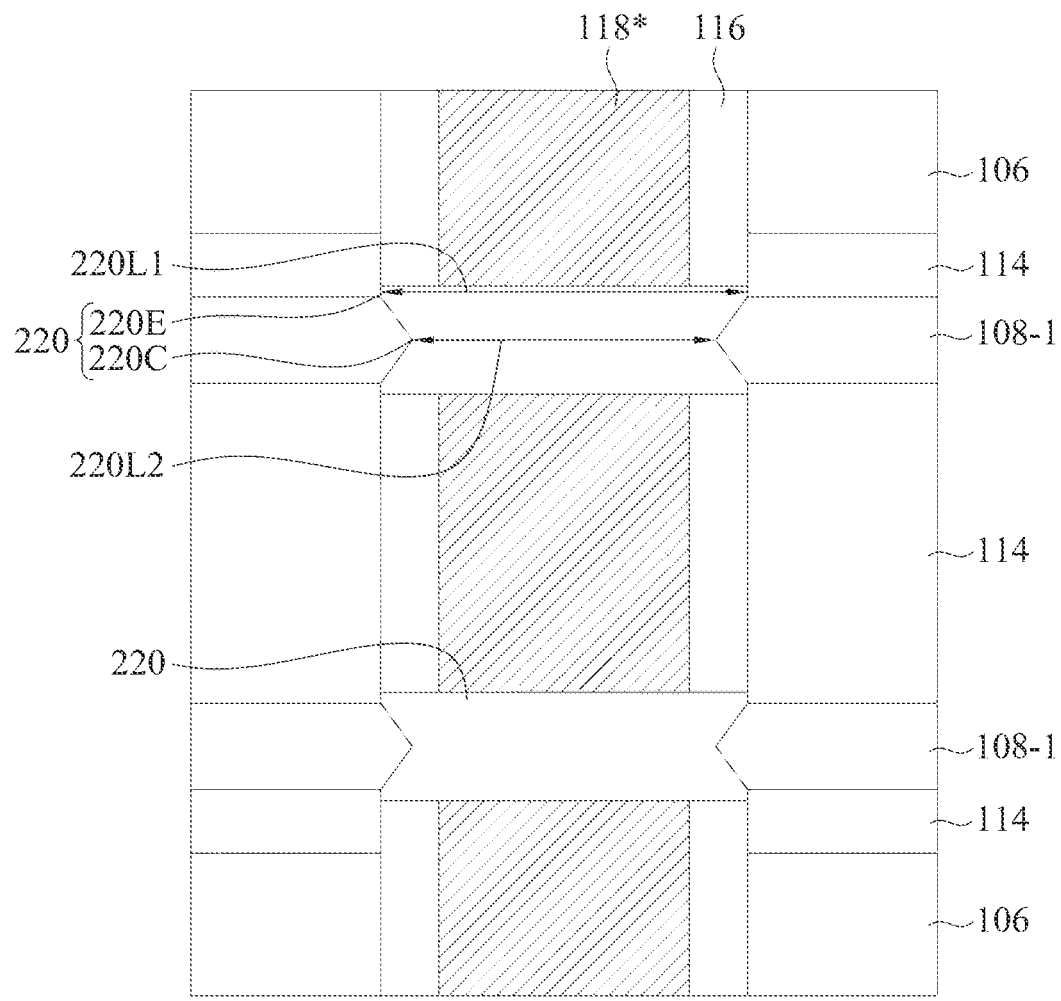
Figure 9B:
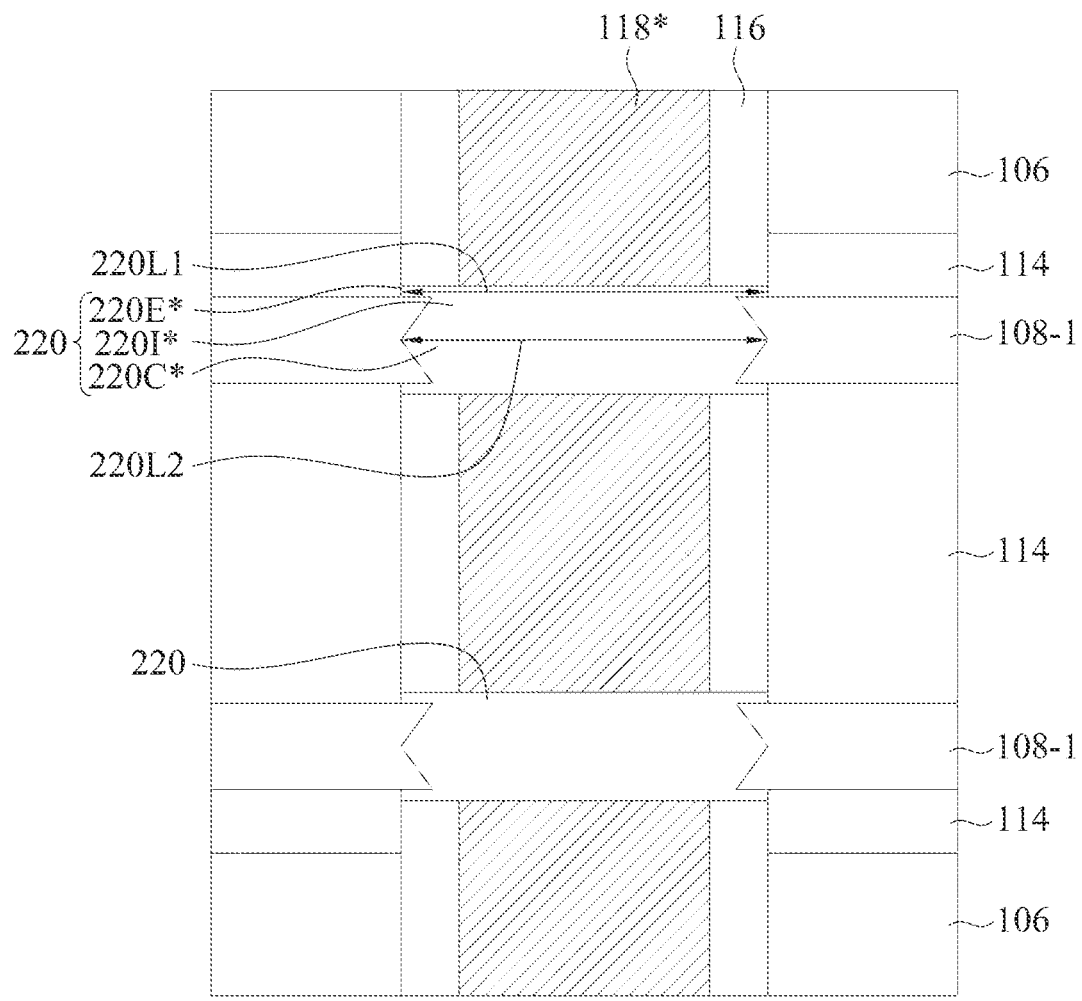
Figure 9C:
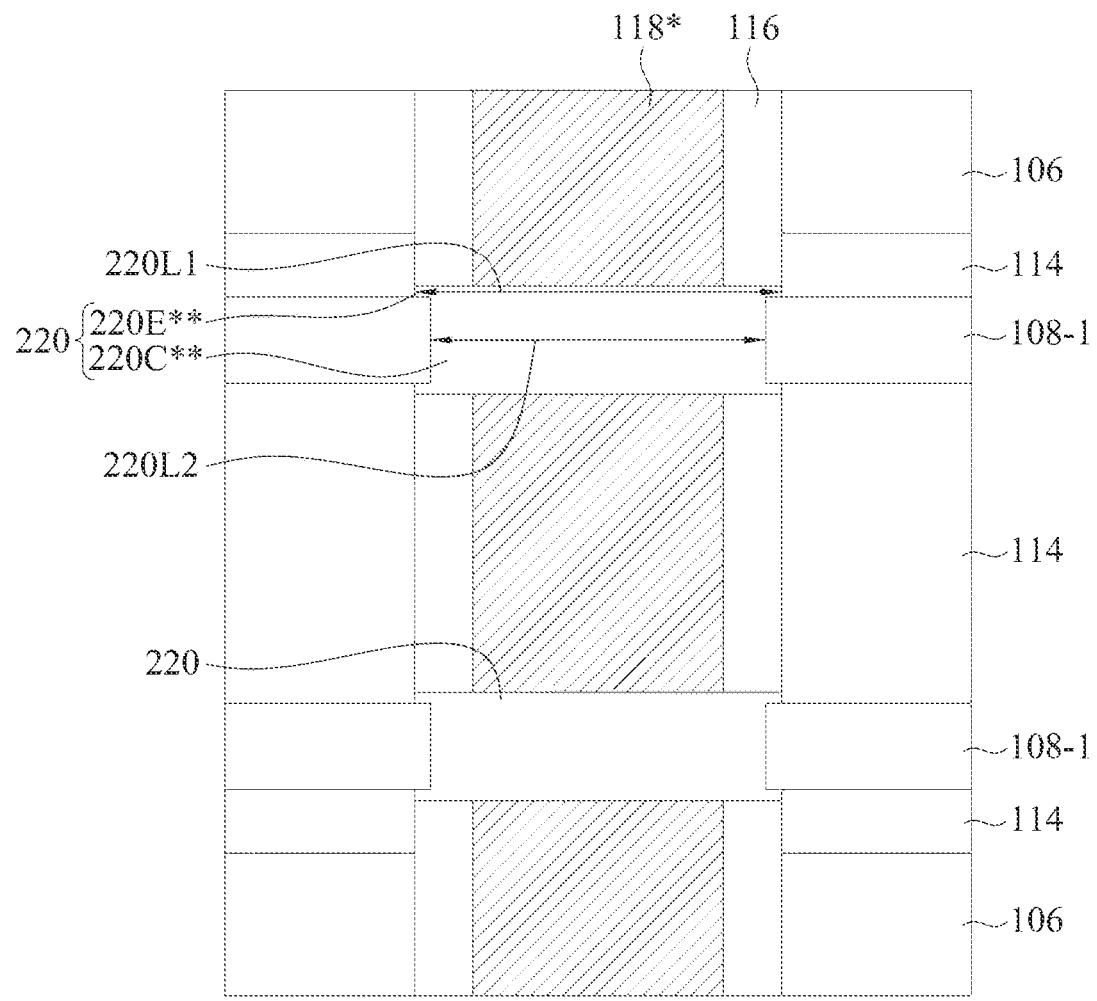
Figure 10:
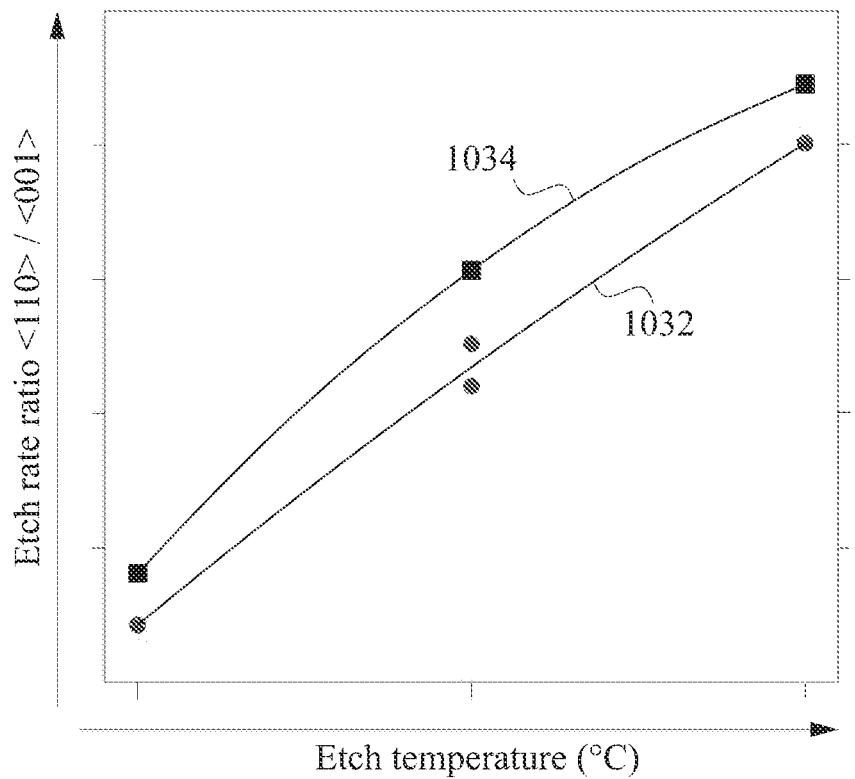
FIGS. 10-12 illustrate control of etch rates by various process parameters during fabrication of a semiconductor device having a channel structure with profile control, in accordance with some embodiments.
Figure 11:
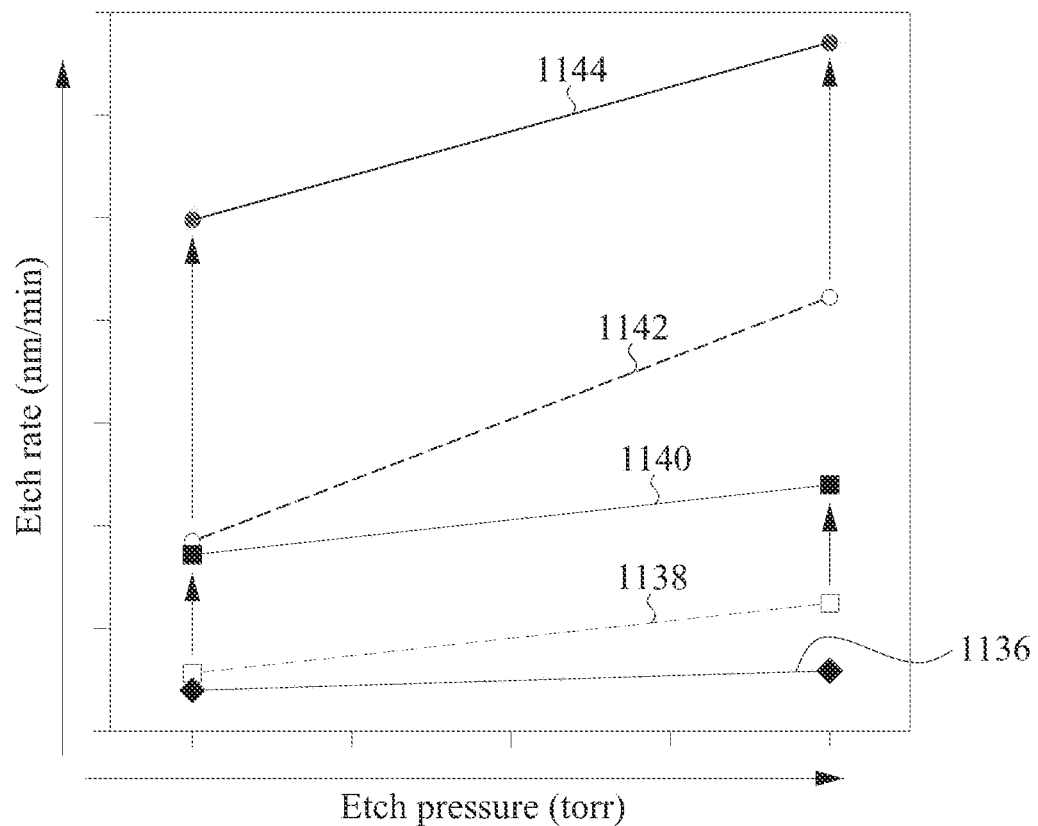
Figure 12:
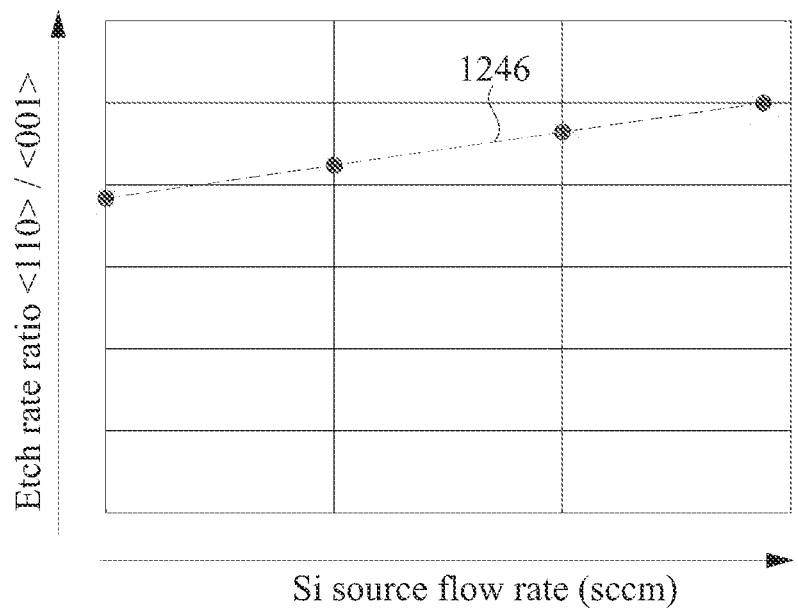

For illustrative purposes, the operations illustrated in FIG. 4 will be described with reference to the example fabrication process for fabricating semiconductor device 100 as illustrated in FIGS. 5-12. FIGS. 5-8 illustrate isometric views of semiconductor device 100 having channel structures with profile control at various stages of its fabrication, in accordance with some embodiments. FIGS. 9A-9C illustrate cross-sectional views of semiconductor device 100 having various channel structures with profile control across plane 803 in FIG. 8, in accordance with some embodiments. FIGS. 10-12 illustrate control of etch rates by various process parameters during fabrication of semiconductor device 100 having channel structures with profile control, in accordance with some embodiments. Elements in FIGS. 5-12 with the same annotations as elements in FIGS. 1, 2, and 3A-3C are described above.

Figure 5:
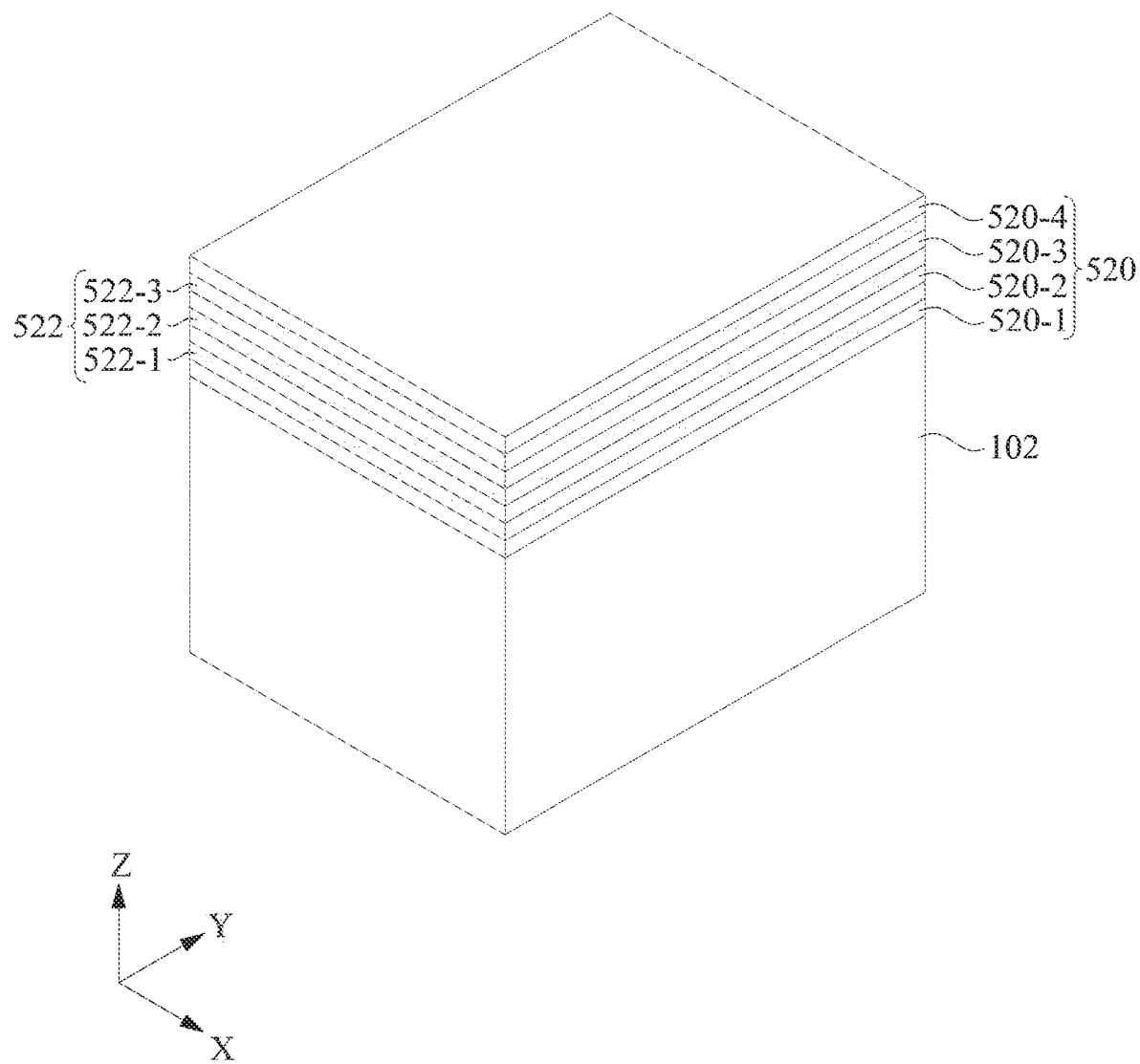
FIGS. 5-8 and 9A-9C illustrate isometric views and cross-sectional views of a semiconductor device having a channel structure with profile control at various stages of its fabrication, in accordance with some embodiments.
Figure 6:
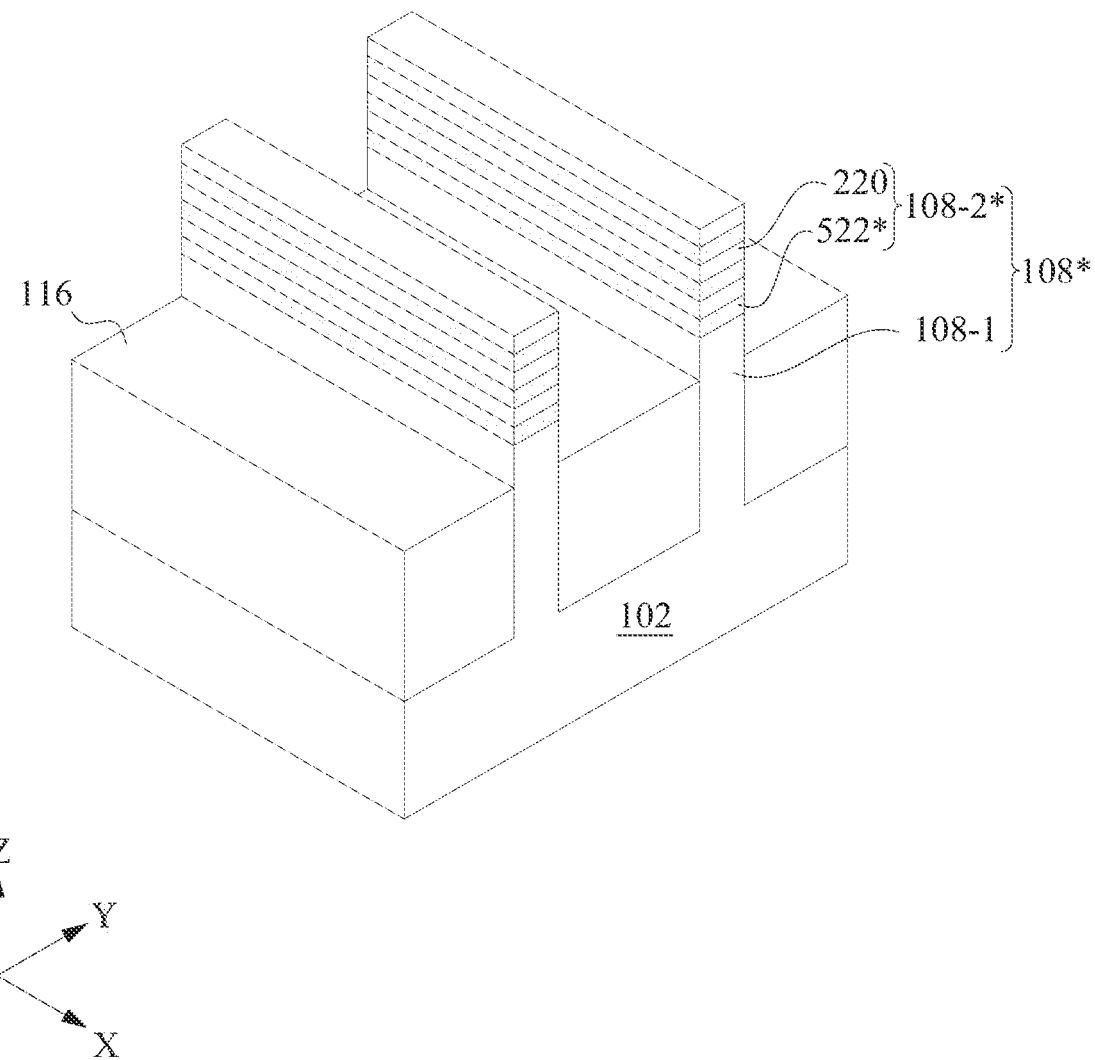

In referring to FIG. 4, method 400 begins with operation 410 and the process of forming a fin structure on a substrate. The fin structure includes a bottom portion on the substrate and a top portion including multiple semiconductor layers. For example, as shown in FIGS. 5 and 6, fin structures 108* can be formed on substrate 102. Fin structures 108* can include fin bottom portion 108-1 on substrate 102 and fin top portion 108-2* on fin bottom portion 108-1. Fin top portion 108-2* can include semiconductor layers 220 and semiconductor layers 522* stacked in an alternating configuration. The formation of fin structures 108* can include sequential operation of: (i) forming semiconductor layers 520-1, 520-2, 520-3, and 520-4 (collectively referred to as "semiconductor layers 520") and semiconductor layers 522-1, 522-2, and 522-3 (collectively referred to as "semiconductor layers 522") on substrate 102, (ii) patterning semiconductor layers 520 and 522 to form fin structures 108*, (iii) filling dielectric materials between fin structures 108* to form STI regions 106; and (iv) etching back STI regions 106 to expose fin top portion 108-2*.

In some embodiments, semiconductor layers 520 and 522 can be epitaxially grown on substrate 102. In some embodiments, semiconductor layers 520 can include a semiconductor material same as substrate 102. Semiconductor layers 522 can include a semiconductor material different from substrate 102. In some embodiments, substrate 102 and semiconductor layers 520 can include Si. Semiconductor layers 522 can include SiGe. In some embodiments, substrate 102 and semiconductor layers 520 can include SiGe. Semiconductor layers 520 can include Si. In some embodiments, a Ge concentration in the SiGe can range from about 0.1 atomic percent to about 50 atomic percent. In some embodiments, semiconductor layers 520 can have a thickness 520t along a Z-axis ranging from about 5 nm to about 15 nm, and semiconductor layers 522 can have a thickness 522t along a Z-axis ranging from about 3 nm to about 10 nm.

Figure 7:
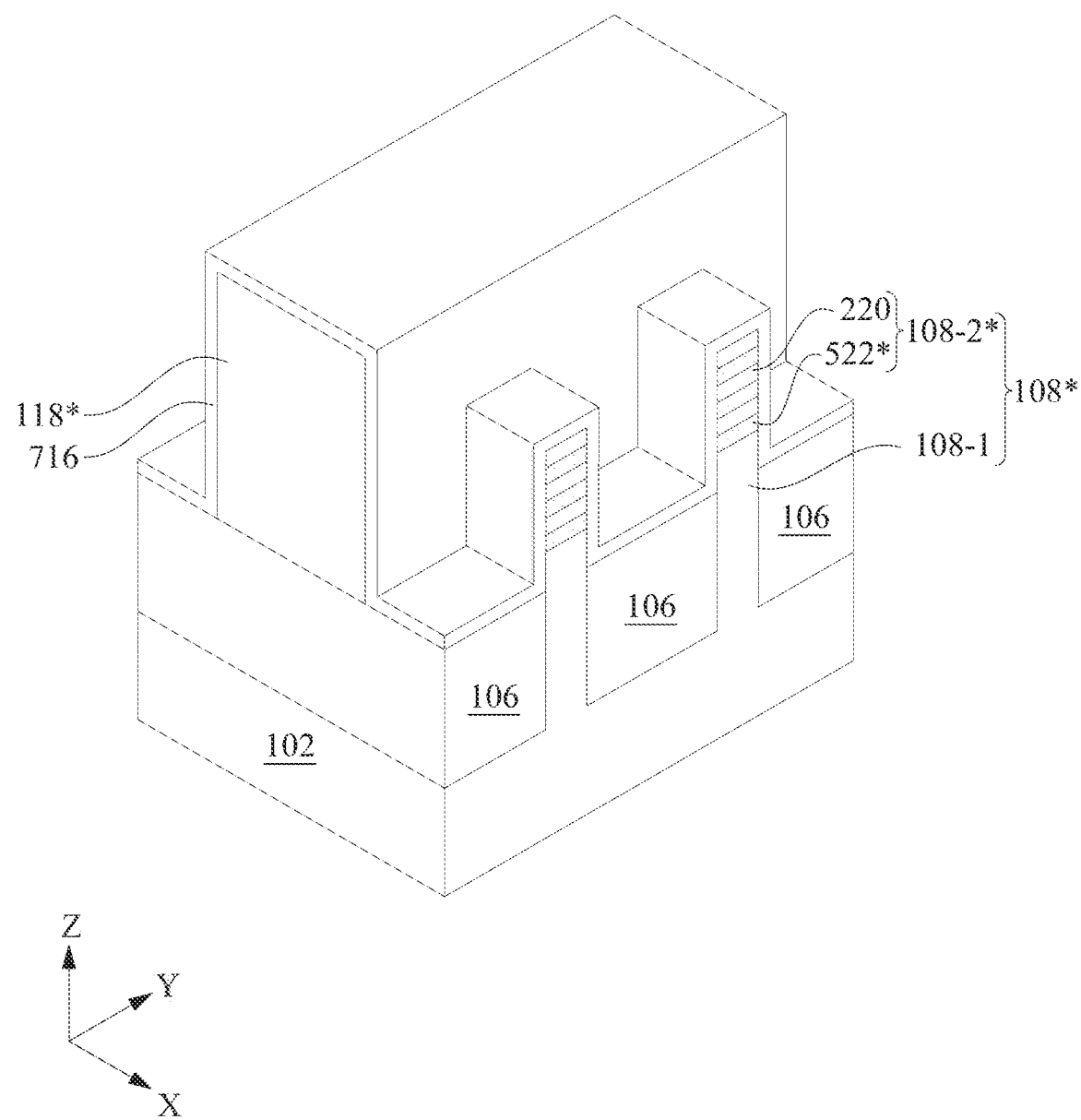

Referring to FIG. 4, in operation 420, a gate structure is formed on the fin structure. For example, as shown in FIG. 7, gate structures 118* can be formed on fin structure 108*. In some embodiments, gate structures 118* can be formed by a blanket deposition of amorphous Si or polysilicon followed by photolithography and etching of the deposited amorphous Si or polysilicon. The formation of gate structures 118* can be followed by a blanket deposition of a dielectric material. In some embodiments, the dielectric material can include $SiO_x$, SiON, $SiN_x$, SiOC, SiCN, SiOCN, and a combination thereof.

Referring to FIG. 4, in operation 430, a first spacer structure is formed on sidewalls of the gate structure and a second spacer structure is formed on sidewalls of the fin structure. For example, as shown in FIG. 8, gate spacers 116 can be formed on sidewalls of gate structures 118* and fin sidewall spacers 114 can be formed on sidewalls of fin structures 108. In some embodiments, gate spacers 116 and fin sidewall spacers 114 can be formed by a directional etch of the blanket deposited dielectric material. The directional etch can remove the dielectric material from top surfaces of gate structures 118*, fin structures 108*, and STI regions 106 and keep the dielectric material on sidewalls of gate structures 118* and fin structures 108*. In some embodiments, as shown in FIG. 7, the blanket deposited dielectric material between adjacent fin structures 108 can remain after the directional etch.

Referring to FIG. 4, in operation 440, a portion of the fin structure outside the gate structure is removed to expose end portions of the multiple semiconductor layers. For example, as shown in FIG. 8, a portion of semiconductor layers 220 and 522* outside gate structures 118 can be removed to expose end portions of semiconductor layers 220 and 522*. In some embodiments, after the removal of the portion of semiconductor layers 220 and 522*, fin bottom portion 108-1 can be coplanar with STI regions 106.

Referring to FIG. 4, in operation 450, the end portions of the multiple semiconductor layers under the first spacer structure is etched to form a recessed region. For example, as shown in FIGS. 8 and 9A-9C, end portions of semiconductor layers 220 under gate spacers 116 can be etched to form sloped recessed center region 220C in FIG. 9A, recessed intermediate region 220I* in FIG. 9B, and flat recessed center region 220C** in FIG. 9C, respectively. In some embodiments, the etching of the end portion of semiconductor layers 220 can include a clean process and an in-situ etch process. The clean process can include a series of plasma clean and wet clean processes to remove oxides, particles, and other contaminations. In some embodiments, the clean process can include a plasma clean with ammonia ($NH_3$) and nitrogen trifluoride ($NF_3$), a first wet clean with ozone ($O_3$) and hydrogen fluoride (HF), a second wet clean with ammonia solution ($NH_4OH$) and deionized (DI) water, a third wet clean with a hot temperature sulfuric acid and hydrogen peroxide mixture (HTSPM) including sulfuric acid ($H_2SO_4$) and hydrogen peroxide ($H_2O_2$), a fourth wet clean with SC1 including $NH_4OH$ and $H_2O_2$, and a fifth wet clean with HF solution.

In some embodiments, the plasma clean with $NH_3$ and $NF_3$ can include a clean step and an anneal step. The clean step can be performed for a time from about 10 s to about 50 s at a temperature from about 10° C. to about 50° C. under a pressure from about 0.1 torr to about 10 torr. During the clean step, a plasma can be formed to remove oxides through following chemical reactions:

$$e^- + NF_3 + NH_3 \rightarrow NH_4F.$$

$$NH_4F + SiO_2 \rightarrow (NH_4)_2SiF_6 + H_2O.$$

A plasma power for the clean step can range from about 10 W to about 50 W. A flow rate of $NH_3$ can range from about 100 standard cubic centimeter per minute (sccm) to about 1000 sccm. A flow rate of $NH_3$ can range from about 50 sccm to about 500 sccm. A flow rate of carrier gas helium (He) can range from about 100 sccm to about 1000 sccm. A flow rate of carrier gas argon (Ar) can range from about 0.1 sccm to about 100 sccm.

The anneal step can be performed for a time from about 50 s to about 300 s at a temperature from about 100° C. to about 300° C. under a pressure from about 0.1 torr to about 10 torr. The anneal step can remove the generated $(NH_4)_2SiF_6$ by sublimation through following chemical reaction:

$$(NH_4)_2SiF_6 \rightarrow NH_3 + SiF_6 + HF.$$

A flow rate of hydrogen ($H_2$) can range from about 0.1 sccm to about 1000 sccm. A flow rate of carrier gas He can range from about 0.1 sccm to about 3000 sccm. A flow rate of carrier gas Ar can range from about 0.1 sccm to about 3000 sccm.

After the plasma clean, the first wet clean with $O_3$ and HF can be performed for a time from about 50 s to about 500 s at a room temperature to remove oxide and carbon contamination. A mixing ratio of O3 to HF can be about 1:3 to about 1:5. The second wet clean with $NH_4OH$ and DI water can be performed for a time from about 10 s to about 300 s at a room temperature to remove particles. A mixing ratio of $NH_4OH$ to DI water can be about 1:50 to about 1:100. The third wet clean with HTSPM can be performed for a time from about 10 s to about 300 s at a temperature from about 100° C. to about 300° C. to remove carbon contamination. A mixing ratio of $H_2SO_4$ to $H_2O_2$ can be about 2:1 to about 4:1. The fourth wet clean with SC1 can be performed for a time from about 10 s to about 300 s at a temperature from about 30° C. to about 50° C. to remove particles. A mixing ratio of $NH_4OH$ to $H_2O_2$ and to DI water can be about 1:8:40 to about 1:8:80. The fifth wet clean with HF and DI water can be performed for a time from about 5 s to about 50 s at a room temperature to remove oxides. A mixing ratio of HF to DI water can be about 1:80 to about 1:120.

The clean process can be followed by the in-situ etch process to control the profile of end portions of semiconductor layers 220. The in-situ etch process and subsequent formation of S/D structures 110 can be performed in a same chamber to prevent oxidation and contamination of the end portions of semiconductor layers 220. In some embodiments, the in-situ etch process can be performed for a time from about 10 s to about 200 s at a temperature from about 650° C. to about 850° C. under a pressure from about 1 torr to about 200 torr. The in-situ etch process can include HCl and other suitable etchants. The in-situ etch process can control etch rates along different crystal directions by the etch temperature, the etch pressure, a flow rate of HCl, and/or a Si source.

For example, FIG. 10 illustrates controlling an etch rate (ER) ratio of <110> direction ER to <001> direction ER by etch temperature during fabrication of semiconductor device 100 with profile control of semiconductor layers 220, in accordance with some embodiments. In some embodiments, semiconductor layers 220 can be SiGe layers with a (110) crystal orientation and can have a thickness from about 10 nm to about 20 nm. Profile 1032 can illustrate the ER ratio for semiconductor layers 220 having SiGe with Ge in a range from about 25 atomic percent to about 35 atomic percent. Profile 1034 can illustrate the ER ratio for semiconductor layers 220 having SiGe with Ge in a range from about 35 atomic percent to about 45 atomic percent. The in-situ etch process can be performed under a pressure from about 1 torr to about 50 torr with a partial pressure for HCl from about 0.1 torr to about 1 torr. As shown in FIG. 10, increase of etch temperature can increase the ER ratio of <110> direction ER to <001> direction ER. A lower ER ratio of <110> direction ER to <001> direction ER can form a sigma (Σ) shape at end portions of semiconductor layers 220. And a higher ER ratio of <110> direction ER to <001> direction ER can form a V shape at end portions of semiconductor layers 220. An intermediate ER ratio of <110> direction ER to <001> direction ER can form a pi (Π) shape at end portions of semiconductor layers 220.

FIG. 11 illustrates controlling ER along <110> and <001> directions by etch pressure during fabrication of semiconductor device 100 with profile control of semiconductor layers 220, in accordance with some embodiments. In some embodiments, semiconductor layers 220 can be SiGe layers with a (110) crystal orientation and can have a thickness from about 10 nm to about 20 nm. Profile 1136 can illustrate a <110> direction ER of semiconductor layers 220 having SiGe with Ge in a range from about 15 atomic percent to about 25 atomic percent. Profile 1138 can illustrate a <001> direction ER of semiconductor layers 220 having SiGe with Ge in a range from about 25 atomic percent to about 35 atomic percent. Profile 1140 can illustrate a <110> direction ER of semiconductor layers 220 having SiGe with Ge in a range from about 25 atomic percent to about 35 atomic percent. Profile 1142 can illustrate a <001> direction ER of semiconductor layers 220 having SiGe with Ge in a range from about 35 atomic percent to about 45 atomic percent. Profile 1144 can illustrate a <110> direction ER of semiconductor layers 220 having SiGe with Ge in a range from about 35 atomic percent to about 45 atomic percent. As shown in FIG. 11, comparing profile 1138 to profile 1140, the ER ratio of <110> direction ER to <001> direction ER can be higher at a lower pressure. Profile 1142 and profile 1144 also illustrate that the ER ratio of <110> direction ER to <001> direction ER can be higher at a lower pressure. Accordingly, the ER ratio of <110> direction ER to <001> direction ER can decrease with the etch pressure.

In some embodiments, the in-situ etch process can also increase the ER ratio of <110> direction ER to <001> direction ER by increasing the flow rate of HCl. Vapor phase HCl can have different etch selectivity along different crystal orientations and can form an isotropic etch profile. In some embodiments, a Si source can be added into HCl to improve the etch selectivity and improve surface roughness of the end portions of semiconductor layers 220. The Si source can include silane ($SiH_4$) or other suitable Si-containing gases. FIG. 12 illustrates controlling an ER ratio of <110> direction ER to <001> direction ER by a flow rate of a Si source during fabrication of semiconductor device 100, in accordance with some embodiments. As shown in profile 1246 in FIG. 12, the ER ratio of <110> direction ER to <001> direction ER can increase with the increase of the flow rate of the Si source. In some embodiments, the flow rate of the Si source can range from about 10 sccm to about 200 sccm to increase the ER ratio by about 5% to about 50%.

In some embodiments, the in-situ etch process can be performed at a temperature from about 650° C. to about 850° C. under a pressure from about 1 torr to about 50 torr with a flow rate of HCl from about 50 sccm to about 1000 sccm to increase the ER ratio of <110> direction ER to <001> direction ER. The ER ratio can range from about 2 to about 5 and end portions of semiconductor layers 220 can have a V shape. In some embodiments, the in-situ etch process can be performed at a temperature from about 600° C. to about 800° C. under a pressure from about 50 torr to about 200 torr with a flow rate of HCl from about 500 sccm to about 2000 sccm to decrease the ER ratio of <110> direction ER to <001> direction ER. The ER ratio can range from about 0.1 to about 1 and end portions of semiconductor layers 220 can have a sigma E) shape. In some embodiments, the in-situ etch process can be performed at a temperature from about 650° C. to about 850° C. under a pressure from about 1 torr to about 50 torr with a flow rate of HCl from about 1000 sccm to about 10000 sccm to balance the ER ratio of <110> direction ER to <001> direction ER. The ER ratio can range from about 1 to about 2 and end portions of semiconductor layers 220 can have a pi (Π) shape.

With the profile control of end portions of semiconductor layers 220, effective channel length 220L2 and the distance between S/D structures 110 on opposite ends of semiconductor layers 220 can be reduced to be less than channel length 220L1 at the edge regions of semiconductor layers 220, as shown in FIGS. 9A-9C. Channel current Ion can increase and device speed can be improved. In some embodiments, with profile control of semiconductor layers 220, contact areas between semiconductor layers 220 and S/D structures 110 can increase, which can reduce the contact resistance between semiconductor layers 220 and S/D structures 110 and further increase channel current Ion. In some embodiments, the dimension of S/D structures 110 can increase when S/D structures 110 extends into end portions of semiconductor layers 220. With the increase of the dimension of S/D structures 110, the resistance of S/D structures 110 and the contact resistance between S/D structures 110 and contact structures (not shown) can decrease. In some embodiments, with profile control, end portions of semiconductor layers 220 can have improved surface roughness. In some embodiments, device performance of semiconductor device 100 can be improved by about 5% to about 10% with profile control of semiconductor layers 220.

Referring to FIG. 4, in operation 460, S/D and metal gate structures are formed. For example, as shown in FIGS. 1, 2, and 3A-3C, S/D structures 110 and metal gate structures 118 can be formed on fin structures 108. The etching of the end portions of semiconductor layers 220 can be followed by in-situ epitaxial growth of S/D structures 110 on fin bottom portion 108-1, as shown in FIGS. 1, 2, and 3A-3C. S/D structures 110 can be in contact with the end portions of semiconductor layers 220 and fin sidewall spacers 114. The in-situ etch of end portions of semiconductor layers 220 and the epitaxial growth of S/D structures 110 can be performed in a same chamber without a vacuum break to prevent oxidation and contamination of the end portions of semiconductor layers 220. The epitaxial growth of S/D structures 110 can be followed by replacing gate structures 118* of amorphous Si or polysilicon with metal gate structures 118, as shown in FIGS. 1, 2, and 3A-3C.

Various embodiments in the present disclosure provide example methods for forming semiconductor layers 220 with profile control semiconductor device 100. The example methods in the present disclosure can form semiconductor layers 220 having recessed end portions and form S/D structures 110 extending into the recessed end portions. In some embodiments, end portions of semiconductor layers 220 can be etched by HCl and the profile of the end portions of semiconductor layers 220 can be controlled by an etch temperature, an etch pressure, a flow rate of HCl, and/or a Si source. In some embodiments, the end portions of semiconductor layers 220 can have a V shape from a top-down view including sloped recessed center region 220C and edge region 220E. In some embodiments, the end portions of semiconductor layers 220 can have a sigma (Σ) shape from a top-down view including recessed intermediate region 220I*. In some embodiments, the end portions of semiconductor layers 220 can have a pi (Π) shape from a top-down view including flat recessed center region 220C**. With profile control of semiconductor layers 220, effective channel length 220L2 can be reduced to increase Ion and device speed. In addition, the resistance between semiconductor layers 220 and S/D structures 110 can be reduced. In some embodiments, device performance can be improved by about 5% to about 10% with profile control of semiconductor layers 220.

In some embodiments, a semiconductor device includes a fin structure on a substrate. The fin structure includes a bottom portion on the substrate and a top portion including multiple semiconductor layers. The semiconductor device further includes a gate structure wrapped around the multiple semiconductor layers and a source/drain (S/D) structure on the bottom portion of the fin structure and in contact with the plurality of semiconductor layers. The S/D structure extends into end portions of the multiple semiconductor layers.

In some embodiments, a semiconductor device includes a fin structure on a substrate. The fin structure includes multiple semiconductor layers. The semiconductor device further includes a gate structure wrapped around each of the multiple semiconductor layers, a spacer structure on the fin structure and in contact with side wall surfaces of the gate structure, and first and second S/D structures on opposite ends of the multiple semiconductor layers. The first and second S/D structures laterally extends below the spacer structure and a distance between the first and second S/D structures is less than a length of the multiple semiconductor layers at the edge region.

In some embodiments, a method includes forming a fin structure on a substrate. The fin structure includes a bottom portion on the substrate and a top portion including multiple semiconductor layers. The method further includes forming a gate structure on the fin structure, forming a first spacer structure on sidewalls of the gate structure and a second spacer structure on sidewalls of the fin structure, removing a portion of the fin structure outside the gate structure to expose end portions of the multiple semiconductor layers, and etching the end portions of the plurality of semiconductor layers under the first spacer structure to form a recessed region. A length of the plurality of the semiconductor layers at an edge region is longer than a length of the plurality of the semiconductor layers at the recessed region.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin structure on a substrate, wherein the fin structure comprises a bottom portion on the substrate and a top portion comprising a plurality of semiconductor layers, and wherein end portions of the plurality of semiconductor layers have a recessed surface;
   a gate structure wrapped around the plurality of semiconductor layers; and
   a source/drain (S/D) structure on the bottom portion of the fin structure and in contact with the recessed surface of the end portions of the plurality of semiconductor layers, wherein the S/D structure extends into the end portions of the plurality of semiconductor layers.

2. The semiconductor device of claim 1, wherein a ratio of a distance of the S/D structure extending into the plurality of semiconductor layer to a length of the plurality of semiconductor layers at an edge region ranges from about 5% to about 15%.

3. The semiconductor device of claim 1, further comprising a spacer structure on the fin structure and in contact with sidewalls of the gate structure, wherein the S/D structure extends laterally beyond a sidewall surface of the spacer structure.

4. The semiconductor device of claim 3, wherein a distance of the S/D structure extending into the plurality of semiconductor layer is less than a width of the spacer structure.

5. The semiconductor device of claim 1, further comprising a plurality of inner spacer structures between the plurality of semiconductor layers, wherein the S/D structure laterally extends beyond sidewall surfaces of the plurality of inner spacer structures.

6. The semiconductor device of claim 1, wherein each of the end portions of the plurality of semiconductor layers has a V shape from a top-down view comprising a sloped recessed center region and an edge region, and wherein the S/D structure extends into the sloped recessed center region.

7. The semiconductor device of claim 1, wherein each of the end portions of the plurality of semiconductor layers has a sigma ($\Sigma$) shape from a top-down view comprising a center region, an edge region, and a recessed intermediate region between the center region and the edge region, and wherein the S/D structure extends into the recessed intermediate region.

8. The semiconductor device of claim 1, wherein each of the end portions of the plurality of semiconductor layers has a pi ($\Pi$) shape from a top-down view comprising a flat recessed center region and an edge region, and wherein the S/D structure extends into the flat recessed center region.

9. A semiconductor device, comprising:
   a fin structure on a substrate, wherein the fin structure comprises a plurality of semiconductor layers;
   a gate structure wrapped around each of the plurality of semiconductor layers;
   a spacer structure on the fin structure and in contact with sidewalls of the gate structure; and
   first and second S/D structures on opposite ends of the plurality of semiconductor layers, wherein the first and second S/D structures laterally extends below the spacer structure, and wherein a distance between the first and second S/D structures at a center region of the plurality of semiconductor layers is less than a length of the plurality of semiconductor layers at an edge region.

10. The semiconductor device of claim 9, wherein a ratio of the distance between the first and second S/D structures to the length of the plurality of semiconductor layers at the edge region ranges from about 70% to about 95%.

11. The semiconductor device of claim 9, wherein a width of the gate structure is less than the length of the plurality of semiconductor layers at the edge region.

12. The semiconductor device of claim 9, wherein a distance of the first and second S/D structures laterally extending below the spacer structure is less than a width of the spacer structure.

13. The semiconductor device of claim 9, further comprising a plurality of inner spacer structures between the gate structure and the first and second S/D structures, wherein the first and second S/D structures laterally extend beyond sidewall surfaces of the plurality of inner spacer structures.

14. The semiconductor device of claim 9, wherein each of end portions of the plurality of semiconductor layers has a V shape, a sigma shape, or a pi ($\Pi$) shape from a top-down view, wherein each of the V, $\Sigma$, and $\Pi$ shapes comprises a recessed region, and wherein the first and second S/D structures extend into the recessed region of the plurality of semiconductor layers.

15. A semiconductor device, comprising:
   a plurality of semiconductor layers on a substrate, wherein:
      each of the plurality of semiconductor layers comprises a center region and an edge region;
      the center region has a first length; and
      the edge region has a second length greater than the first length;
   a gate structure in contact with the edge region and wrapped around the edge region of the plurality of semiconductor layers; and
   a source/drain (S/D) structure adjacent to end portions of the plurality of semiconductor layers, wherein the S/D structure is in contact with the center region and the edge region of the plurality of semiconductor layers.

16. The semiconductor device of claim 15, wherein a ratio of the first length to the second length ranges from about 70% to about 95%.

17. The semiconductor device of claim 15, wherein a width of the gate structure is less than the second length.

18. The semiconductor device of claim 15, further comprising a spacer structure above the plurality of semiconductor layers and on a sidewall of the gate structure, wherein a distance of the S/D structure laterally extends below the spacer structure is less than a width of the spacer structure.

19. The semiconductor device of claim 15, further comprising a plurality of inner spacer structures between the gate structure and the S/D structure, wherein the S/D structure laterally extends towards the plurality of semiconductor layers beyond sidewall surfaces of the plurality of inner spacer structures.

20. The semiconductor device of claim 15, wherein:
   each of the end portions of the plurality of semiconductor layers has a V shape, a sigma (Σ) shape, or a pi (Π) shape from a top-down view;
   each of the V, Σ, and Π shapes comprises a recessed region; and
   the S/D structure extends into the recessed region of the plurality of semiconductor layers.

\* \* \* \* \*

UNITED STATES PATENT AND TRADEMARK OFFICE
CERTIFICATE OF CORRECTION

| | | |
|---|---|---|
| PATENT NO. | : 12,183,797 B2 | Page 1 of 1 |
| APPLICATION NO. | : 17/471863 | |
| DATED | : December 31, 2024 | |
| INVENTOR(S) | : Hsu | |

It is certified that error appears in the above-identified patent and that said Letters Patent is hereby corrected as shown below:

On the Title Page

Item (71), in "Applicant", Line 1, delete "Semicondcutor" and insert -- Semiconductor --, therefor.

In the Specification

In Column 13, Line 20, delete "E)" and insert -- ($\sum$) --, therefor.

In the Claims

In Column 16, Claim 14, Line 35, after "sigma" insert -- ($\sum$) --.

Signed and Sealed this
Eleventh Day of March, 2025

Coke Morgan Stewart
*Acting Director of the United States Patent and Trademark Office*